United States Patent [19]

Eguchi et al.

[11] Patent Number: 4,804,331
[45] Date of Patent: Feb. 14, 1989

[54] DEVICE FOR INSTALLING PRINTED CIRCUIT BOARD

[75] Inventors: Masaharu Eguchi; Yutaka Fujiwara; Haruhiko Yamanouchi; Jun Terashima, all of Kanagawa, Japan

[73] Assignee: Canon Kabushiki Kaisha, Tokyo, Japan

[21] Appl. No.: 134,976

[22] Filed: Dec. 18, 1987

[30] Foreign Application Priority Data

Dec. 27, 1986 [JP] Japan .................... 61-200442[U]
Dec. 27, 1986 [JP] Japan .................... 61-200443[U]

[51] Int. Cl.[4] .................................... H01R 9/07
[52] U.S. Cl. .................................... 439/162; 439/67; 439/609
[58] Field of Search .................... 439/67, 492, 497, 609

Primary Examiner—William L. Sikes
Assistant Examiner—Akm E. Ullah
Attorney, Agent, or Firm—Fitzpatrick, Cella, Harper & Scinto

[57] ABSTRACT

A device for electrically connecting first and second members movable relative to each other, includes a flexible printed circuit board located between the first and second relatively movable members. The flexible printed circuit board has a first side piece and second side piece divided by a cutout made in the flexible printed circuit board. One of the first and second side pieces is bent about 180° in the direction of the relative movement of the first and second members to form a turned "U" shaped portion. The first side piece has its free end portion fixed to the first member and the second side piece has its free end portion fixed to the second member, so that the displacement of the printed circuit board resulting from the relative movement of the first and second members is absorbed by movement of the "U" shaped portion.

9 Claims, 9 Drawing Sheets

DEVICE FOR INSTALLING PRINTED CIRCUIT BOARD

BACKGROUND OF THE INVENTION

1. Field of the Invention:

This invention relates to flexible printed circuit boards for use in electrical connection between two members movable relative to each other and, more particularly, to a method for installing the same.

2. Description of the Related Art:

The flexible printed circuit board is so thin and so sufficient in flexibility as to bend itself to any desired strong curvature and to be installed in a narrow space of the interior of the instrument with good mobility of the bent portion thereof. Hence, it has found its use in cameras at their housing and lens barrels, and other compact instruments.

To electrically connect two members movable relative to each other by means of the flexible printed circuit board, a wide variety of methods have been proposed. For example, U.S. Pat. Nos. 3,433,889 and 4,596,454 disclose that the flexible printed circuit board is curved at the center or an intermediate portion of the length to the letter "U" shaped turn, or a bellows-like waving form, thus being made to cope with the variation of the distance between the two movable members.

In FIGS. 1 through 3(B), there is shown an expanded type of the one of the above-described concepts which has the central U-turn in the flexible printed circuit board. That is, when to install the printed circuit board in the lens barrel, the space it occupies is, as shown in FIGS. 1 and 2, often taken between a fixed tube 61 whose one end is coupled with the camera body and a movable sleeve 62 for focusing or zooming.

In the case where the electrical connection from the fixed tube 61 to the movable sleeve 62, for example, for giving and receiving the zoom signals, is very long in the axial distance between the inlet and outlet for the zoom signal, the flexible printed circuit board 63 is installed in such a manner as to permit formation of two letter U-shaped bent portions 64 and 65 as shown in FIG. 2. And, these bent portions 64 and 65 are arranged to change their axial positions in accompaniment with movement of the sleeve 62.

In such a manner, according to the prior art, for the case in which the ends of the printed circuit board are connected to the respective points in position spaced far away from each other, the required number of bent portions of letter "U" shape to be formed midway therebetween was two as indicated at 64 and 65 when it was installed in the narrow space. For this reason, the space between the fixed tube 61 and the movable sleeve 62 (the radial length of the gap) had to be taken, in principle, at as high a value as the sum of the diameters A and B of the U-shaped bent portions 64 and 65 respectively. This led to a problem that the lens barrel was unavoidably of large diameter. If the height of that space was decreased, it would result that, as shown in FIG. 3(B), one of the bent portions, in this instance, 64, is caused to come into contact with the substrate of the board 63. In this case, therefore, as the repetition of operation of the movable sleeve 62 increased, the frictionally contacting areas of the upper surface of the bent portion 64 and the lower surface of the board 63 eventually worn out with a damage of the cover layer. Also, because the movement of the movable sleeve 62 occasionally gave stress to the board 63, the bent portions 64 and 65 were hindered from smoothly changing their positions. Again, if such a stress was suddenly released, the board 63 would take an abnormal form. Thus, there was a high possibility of damaging the electrical fidelity of the printed circuit board. And, in order to insure that the printed circuit board smoothly moved itself despite the presence of the two bent portions of letter "U" shape, the diameter of the movable sleeve 62 tended to increase.

Next, using FIG. 4, another problem of the conventional example is described. For the electrical connection from a fixed tube 51 to a movable sleeve 52, for example, the electrical power supply line and the input and output lines for the zoom signal, motor control signal and lens mode selection signal, a stripe-shaped flexible printed circuit board 53 is set up in such a way as to form a bent portion 54 of letter "U" shape.

To allow the bent portion 54 to change its axial position under such a condition that a part of the board 53 which is on the upper side of the bent portion 54 is always in contact, over the entire width, with the inner surface of the movable sleeve 52, the movable sleeve 52 is provided with an axial shallow groove 55 of flat bottom.

With this, when the movable sleeve 52 moves axially, the bent portion 54 can sweep along the groove 55 without causing its side edges to be pressed against the otherwise curved inner surface of the sleeve 52. Hence, no unduly large stress is applied to the circuit pattern of the board 53 at the center of the width thereof. Thus, the board can change in position without damaging the electrical fidelity.

However, formation of such an axial groove 55 by machining in the inner surface of the sleeve 52 under the condition that its bottom was maintained sufficiently flat over the entire length was far more difficult than when it was formed on the outer surface of the tube 51.

Particularly when the axial length of the groove 55 got longer, that difficulty was rapidly increased regardless of whether to employ the key seat milling machine or the plastics molding means. In the latter case, the structure of construction of the mold became very complicated. Also, since the thickness of the sleeve below the groove is very short compared with the other part, when the parts are made up of plastics by molding means, such a partial disconformity of the thickness is not favorable from the precision accuracy standpoint and in an aesthetic sense.

SUMMARY OF THE INVENTION

An object of the present invention is to provide a device for installing a flexible printed circuit board for electrical connection between two members movable relative to each other in such a manner that the flexible printed circuit board can smoothly change its position while still preserving high electrical fidelity.

DETAILED DESCRIPTION OF THE PREFERRED EMBODIMENTS

Figure 1:
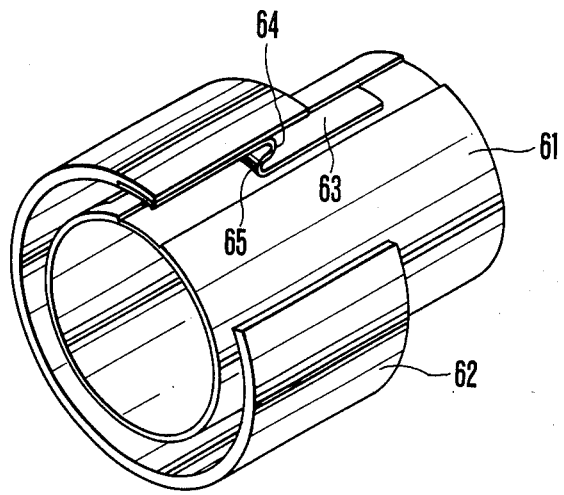
FIG. 1 is a perspective view of the lens barrel with a portion broken away to illustrate the conventional method of installation of the printed circuit board.
Figure 2:
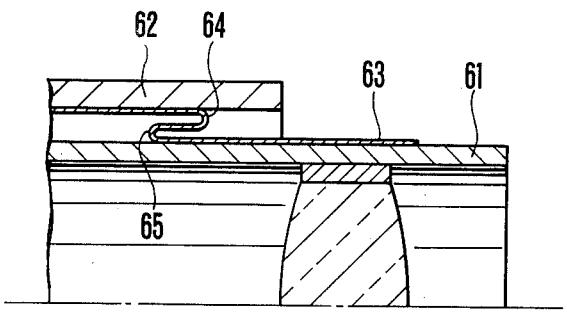
FIG. 2 is a sectional view of the main parts of FIG. 1.
Figure 3A:
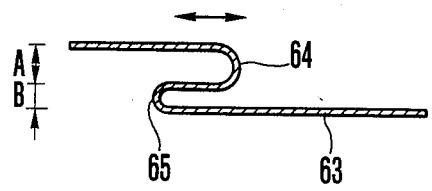
FIGS. 3(A) and 3(B) are diagrams taken to explain the problem of FIG. 1.
Figure 3B:
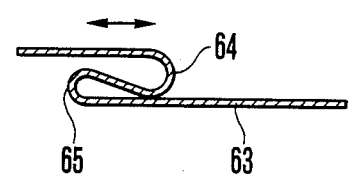
Figure 4:
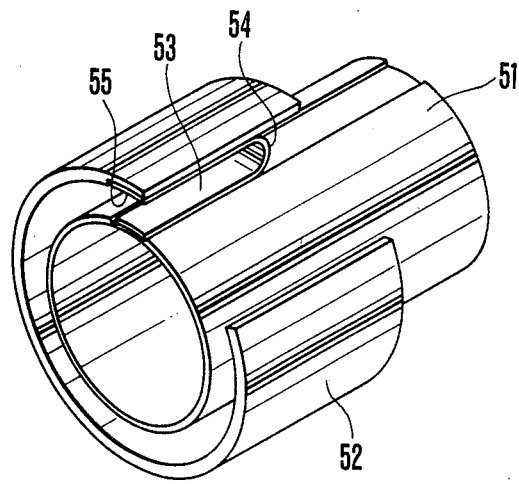
FIG. 4 is a perspective view of the lens barrel with a portion broken away to illustrate another example of the conventional installation of the printed circuit board.
Figure 5:
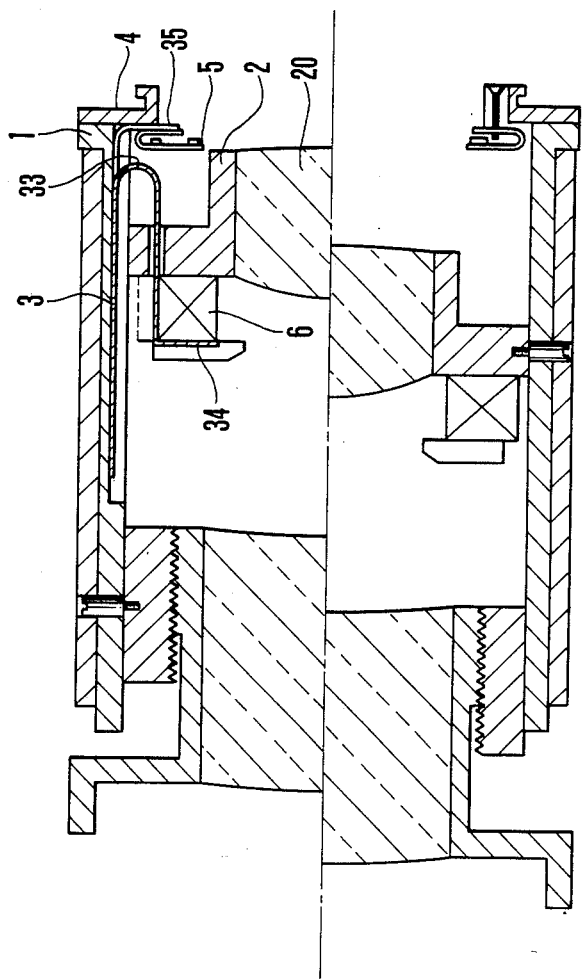
FIG. 5 is a longitudinal section view of a first embodiment of the invention applied to part of the lens barrel.

In FIG. 5 there is shown the first embodiment of the invention applied to the lens barrel.

The lens barrel comprises a fixed tube 1 as the first member and a movable sleeve 2 as the second member. A movable lens system 20 for zooming is held in the inner diameter of the sleeve 2. The fixed tube 1 has a mount 4 at the rear end on which a main printed circuit board 5 is positioned. An actuator (electric motor) 6 for driving a diaphragm is fixedly carried on the movable sleeve 2. The main board 5 and the actuator 6 are electrically connected to each other by a flexible printed circuit board 3.

Figure 6A:
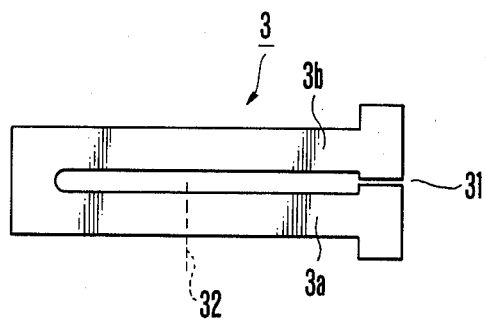
FIG. 6(A) is an expanded view of the printed circuit board of the invention.
Figure 7:
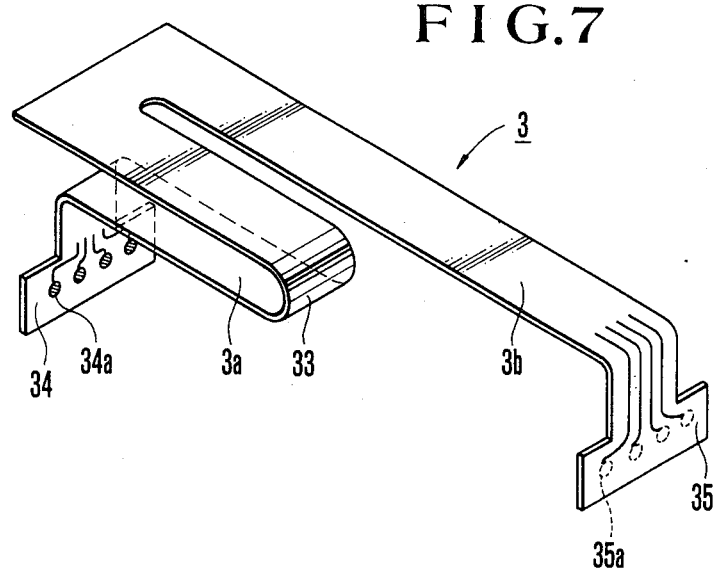
FIG. 7 is a perspective view illustrating a method of installing the printed circuit board according to the first embodiment of the invention.

In this embodiment, the flexible printed circuit board 3 is made up from, for example, a double-width stripe of printed circuit board shown in FIG. 6(A). By providing a longitudinal cutout portion 31 of direction almost parallel to the direction of movement of the movable sleeve 2, two parts, or a first side piece 3a and a second side piece 3b, are formed. And, one side piece 3a is bent 180° from the neighborhood of a dashed line 32 to a form shown in FIG. 7. In FIG. 7, 33 denotes a bent portion of letter "U" shape. A free end 34 of the first side piece 3a is provided with lead patches 34a (exposed portions for electrical interconnection of electrically conductive patterns) to be coupled to the actuator 6. A free end 35 of the second side piece 3b is provided with lead patches 35a (exposed portions for electrical interconnection of the electrically conductive patterns) to be coupled to the main printed circuit board 5.

The printed circuit board 3 of the form shown in FIG. 7, when installed within the lens barrel of FIG. 5, has its one set of lead patches 34a electrically connected to the actuator 6 mounted on the movable sleeve 2 and its opposite set of lead patches 35a electrically connected to the main printed circuit board 5, wherein the bent portion 33 falls within the space between the end portions 34 and 35.

And, arrangement is made so that, as the movable sleeve 2 moves axially, the bent portion 33 of the printed circuit board 3 changes its position.

Figure 6B:
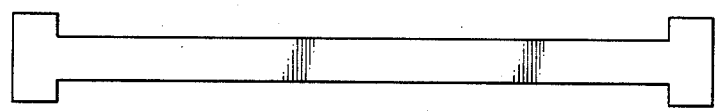
FIG. 6(B) is an expanded view of the conventional printed circuit board.

Since the printed circuit board 3 is constructed in the form shown in FIG. 6(A), the embodiment of the invention has a feature that a greater number of items can be taken out of a sheet of substrate of certain size, leaving smaller least material waste than when the board is constructed in a merely one-directionally extended form shown in FIG. 6(B) as in the prior art.

It should be noted that, this embodiment may be modified so that instead of making erect the end portions 34 and 35, they extend in the same plane as that of the side pieces 3a and 3b.

In this embodiment, by adopting such a form of the printed circuit board, it is made possible that even in the case when the electrical coupling places on the first and second members movable relative to each other are long spaced away from each other, only one bent portion of letter "U" shape suffices for absorbing the variation of the position of the printed circuit board resulting from the movement of the movable sleeve. This allows for smooth operation of the movable sleeve. Another advantage arising from the reduction of the number of bent portions of letter "U" shape to only one is that the diameter of the outer tube of the lens barrel can be reduced.

Figure 8:
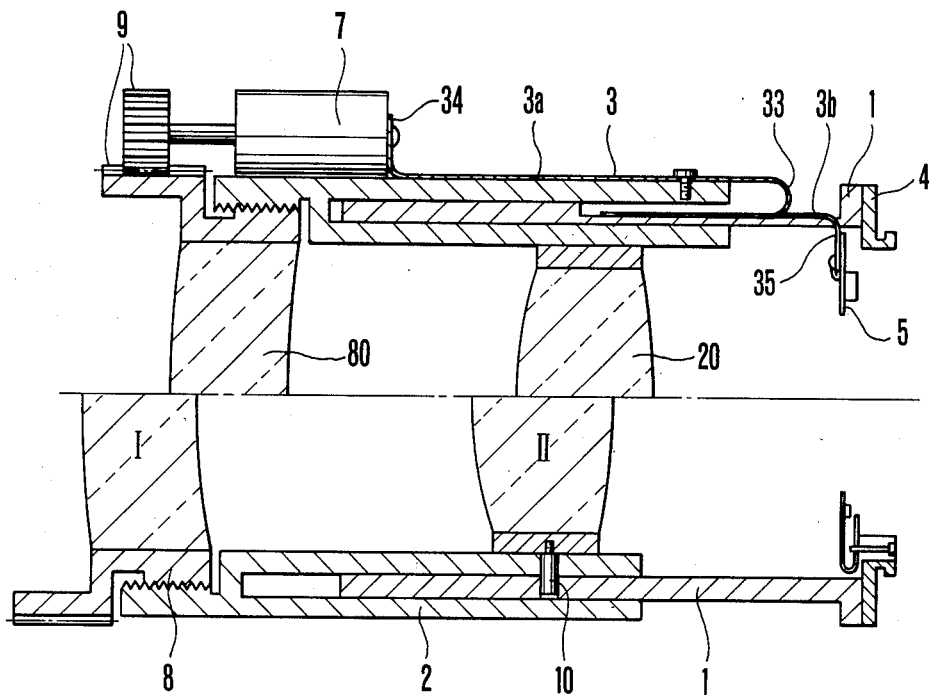
FIG. 8 is a partly side elevational sectional view of a second embodiment of the invention.
Figure 9:
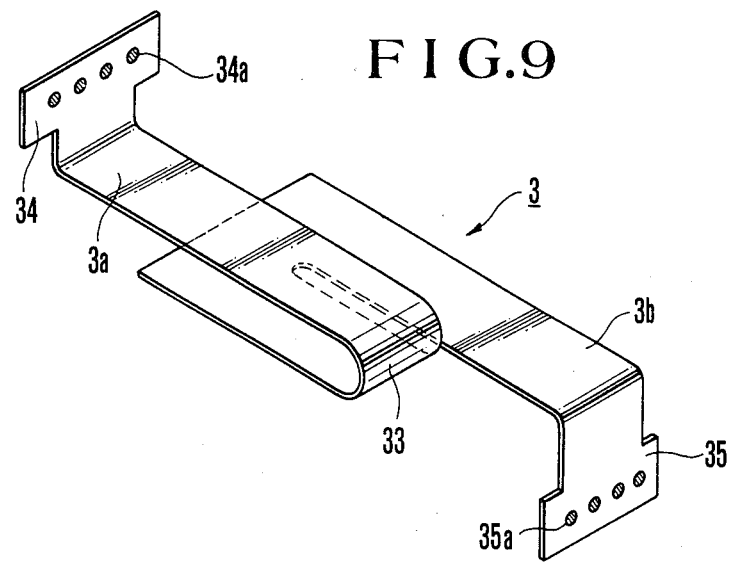
FIG. 9 is a perspective view of the installation of the printed circuit board of FIG. 8.

FIGS. 8 and 9 show another embodiment of the invention where the flexible printed circuit board 3 is constructed in a different form from that shown in FIGS. 5 and 7, and the same reference numerals have been employed to denote the similar parts to those shown in the latter.

In this embodiment, the erected end portions of the two side pieces 3a and 3b of the printed circuit board 3 direct to opposite direction to each other, as the movable sleeve 2 is positioned outside the fixed tube 1. A set of lead patches 34a on the front end portion 34 are connected to an electric motor 7 on the outer surface of the movable sleeve 2, and a set of lead patches 35a of the rear end portion 35 are connected to the main printed circuit board 5 positioned inside the fixed tube 1.

Incidentally, the motor 7 is used to drive a focusing ring 8 holding a focusing lens system 80 through a gear 9. A pin 10 restrains the movable sleeve 2 from rotation relative to the fixed tube 1. Though, in the foregoing embodiments, the flexible printed circuit board is shown as oriented with its length to the longitude (axial direction) of the lens barrel, the present invention can be applied even to the case where the length of the flexible printed circuit board extends along the circumference of the lens barrel to effect an equivalent result.

According to the first and second embodiments, the use of such forms as described above in constructing the flexible printed circuit board provides a possibility of designing the first and second members movable relative to each other as constituting part of the lens barrel in such a way that the space the electrical connection between these members occupies is shorter in height and better in manufacturability than was heretofore possible. Further, it permits smooth variation of the position of the printed circuit board to occur, since the movement of the movable member never gives an unduly large stress to it. Thus, an installation of the printed circuit board which enables the high electrical fidelity to be preserved and the size of the instrument employing the same to be minimized can be achieved.

Next, a third embodiment of the invention is described.

Figure 10A:
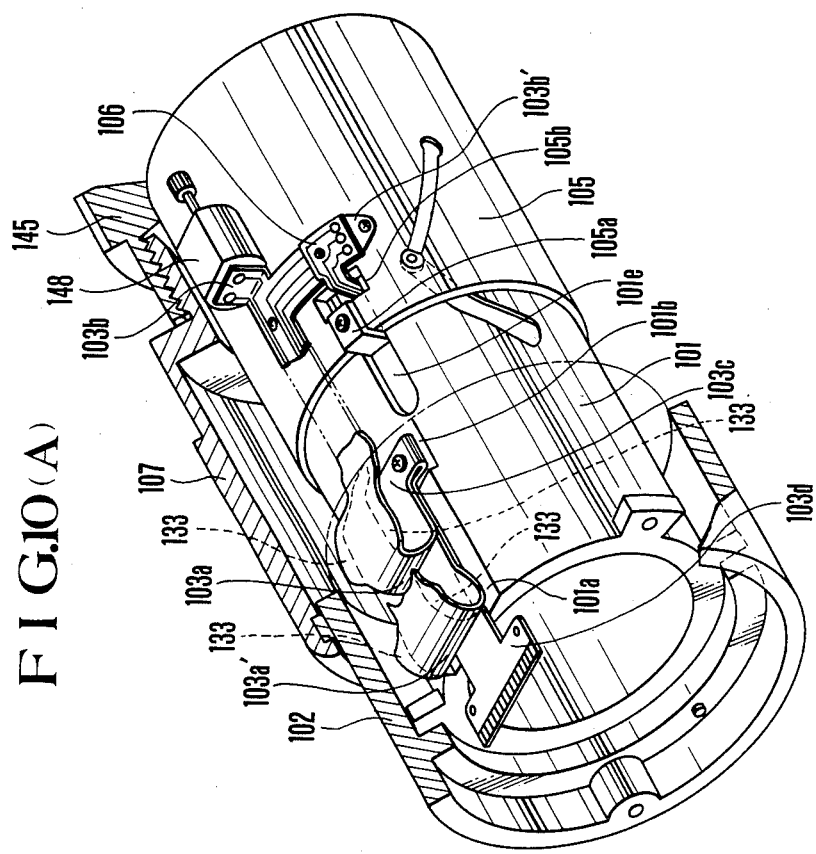
FIG. 10(A) is a perspective view of a third embodiment of the invention applied to part of the lens barrel.
Figure 12:
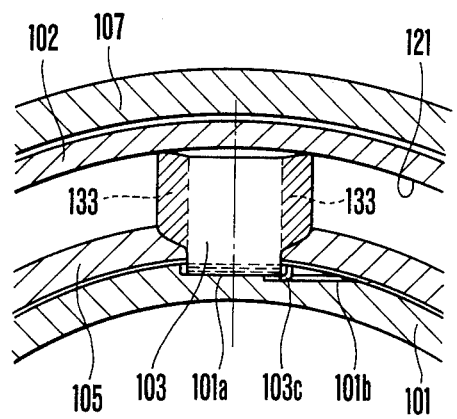
FIG. 12 is a fragmentary front view of the lens barrel with the bent portion of the board of FIG. 10(A) in detail.
Figure 13:
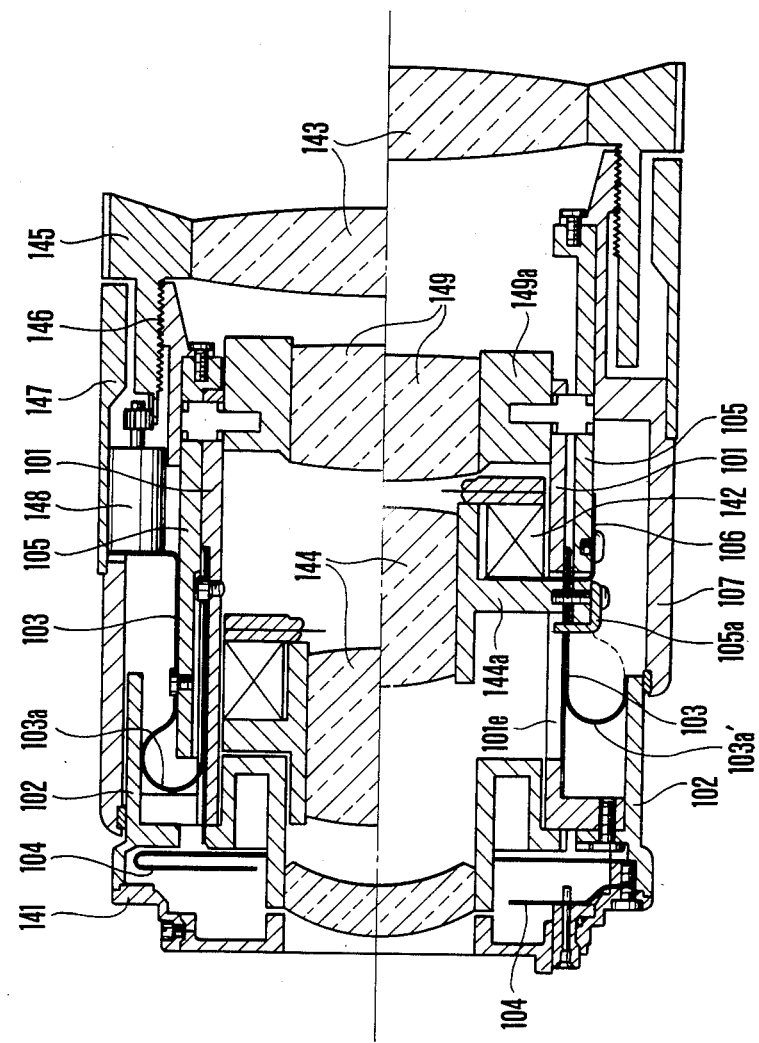
FIG. 13 is a sectional view of the lens barrel of FIG. 10(A).

FIG. 10(A) is a schematic perspective view of the third embodiment of the invention applied to the lens barrel, FIG. 12 is a fragmentary cross-sectional view of the lens barrel of FIG. 10(A), and FIG. 13 is a longitudinal section view of the lens barrel of FIG. 10(A).

In these figures, a fixed tube 101 as the first member is fixedly secured to a second fixed tube 102 having a coupling mount 141. A movable sleeve 105 as the second member fixedly carries a lens system, is fitted on the outer diameter of the fixed tube 101, and is axially movable by a longitudinal key slot 101e and a key 105a in engagement.

Figure 10B:
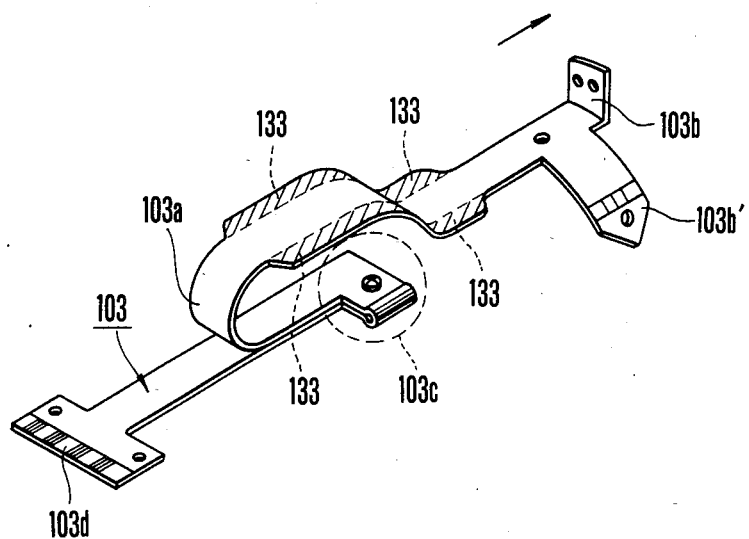
FIGS. 10(B) and 10(C) are perspective views illustrating change of the position of the printed circuit board of FIG. 10(A).
Figure 10C:
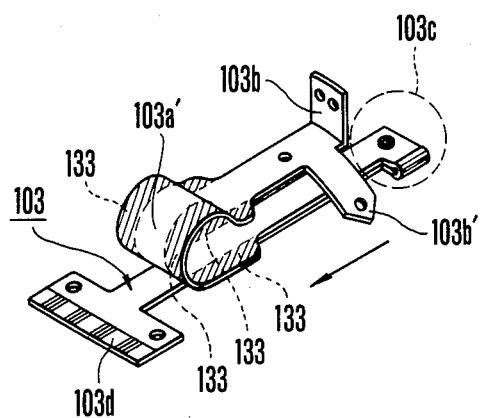
Figure 11:
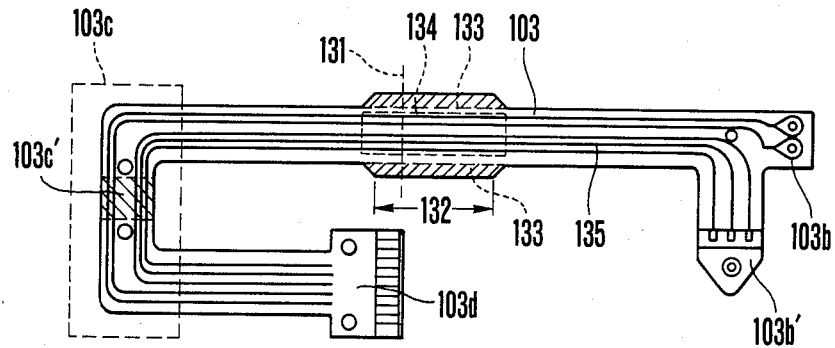
FIG. 11 is an expanded view of the printed circuit board of FIG. 10(A).

103 is a flexible printed circuit board of, for example, band form whose expanded view is shown in FIG. 11. In actual practice, it takes the form shown in FIGS. 10(B) and 10(C). In this embodiment, the printed circuit board 103 is bent 180° at the neighborhood of a position indicated by a dashed line 131 shown in FIG. 11 to form a turned portion 103a of letter "U" shape and its fixing portion 103c is inserted into a space formed between the movable sleeve 105 serving as the outer barrel and the fixed tube 101 serving as the inner barrel.

Ends 103b and 103b' of the printed circuit board 103 are electrically connected to an AF actuator 148 and another printed circuit board 106 on the movable sleeve 105, respectively, and the other end 103d is electrically connected to yet another printed circuit board (not shown) on the second fixed tube 102.

The turned portion 103a of the printed circuit board 103 takes a position shown in FIG. 10(B) when the movable sleeve 105 is in the terminal end of forward movement, or another position 103a' shown in FIG. 10(C) when in the end of rearward movement.

The printed circuit board 103 is fastened to the fixed tube 101 at the fixing portion 103c. In order to do this, the board of FIG. 11 is first folded in intimate contact in the circumferential direction and then fixedly secured to the fixed tube 101 on a flat plane portion 101a thereof by a screw fastener.

To prevent breaking of wire at the folded edge, some curvature R must be retained. This results in formation of a club at the fixing portion 103c. As an escape for the club, the flat plane portion 101a of an external axial groove is made recess by one step at a portion 101b beneath the club.

Since the recessed portion 101b takes its place sideward from the center of the width of the groove 101a, though the bottom of the groove is dug by one step, the thickness of the fixed tube 101 is never largely decreased, as will be seen from FIG. 12.

In FIG. 13, an actuator 142 for the diaphragm is fixedly carried on a holder tube 114a for holding the third lens unit 144 which moves at exactly or nearly the same speed as that of movement of the first lens unit 143, and is electrically connected to the flexible printed circuit board 103 through another printed circuit board 106. It should be noted that the printed circuit board 106 passes through the longitudinal key slot 101e of the fixed tube 101 and a hole portion 105b of the movable sleeve 105 and projects radially outwardly of the movable sleeve 105, thus reaching the printed circuit board 103.

Though, in this embodiment, the longitudinal key slot 101e is utilized as the hole for passing the printed circuit board 106 across the wall of the fixed tube 101 to save the addition of another hole, if there is room for creation of a space therefor, another long slot to be solely used for the printed circuit board 106 may be provided.

Incidentally, in FIG. 13, the lens barrel further includes a manual focusing ring 145, a helicoid threaded member 146, an outer or decoration barrel 147, an AF actuator 148 and a holder tube 149a for holding the second lens unit 149.

And, arrangement is such that as the movable sleeve 105 moves axially, the turned portion 103a of the printed circuit board 103 axially displaces itself.

Because the second fixed tube 102 of round inner cross-section has no internal groove, both side edges of the upper root of the turned portion 103a of the printed circuit board 103 are subjected to frictional sideway movement on the inner surface 121 of the second fixed tube 102, as the turned portion 103a moves. It is, therefore, another feature of this embodiment that portions 133 of the printed circuit board 103 whose edges come into contact with the innersurface 121 of the second fixed tube 102 when it is turned, is widened in the circumference direction as compared with other portions. No connection patterns are formed in both widened portions 133.

And, when an area 132 where the turned portion 103a occupies comes into contact with the inner surface 121 of the second fixed tube 102, as shown in FIG. 12, only part of the widened portions 133 is allowed to come into contact with the inner surface 121 in circumferentially bending relation due to the flexibility of the printed circuit board 103.

Thereby, the sideward bending is prevented from occurring up to a main area 134 where the connection pattern 135 is formed in the flexible printed circuit board 103. Thus, this embodiment has achieved realization of the electrical connection with high fidelity.

It should be noted that even in application of the invention to any other types of lens barrels where the fixed tube 101 and the movable sleeve 105 are exchanged, or where both members are made movable, the objects of the invention can be accomplished.

According to the third embodiment, for the electrical connection between the fixed and movable members of the lens barrel by means of the flexible printed circuit board in a space therebetween of which the outer circumferential wall is curved, despite that its side edges of the longitudinally turned portion are pressed on the curved outer wall, the resultant lateral bending is prevented from occurring directly to the central or connection pattern portion. Hence, the use of the invention provides a possibility of installing the printed circuit board in the instrument of reduced size with improved manufacturability and electrically high fidelity.

What is claimed is:

1. A device for electrically connecting first and second members movable relative to each other, comprising a flexible printed circuit board located between said first and second relatively movable members, said flexible printed circuit board having a first side piece and a second side piece divided by a cutout made in said flexible printed circuit board, one of said first and second side pieces being bent about 180° in the direction of the relative movement of the first and second members to form a turned "U" shaped portion, said first side piece having its free end portion fixed to said first member and said second side piece having its free end portion fixed to said second member, so as to absorb displacement of said printed circuit board resulting from the relative movement of said first and second members by movement of said "U" shaped portion.

2. A device according to claim 1, wherein said first and said second members are in such relation that one of them is fixed, and the other is movable.

3. A device according to claim 2, wherein said movable member fixedly carries an actuator connected to the free end portion of said printed circuit board.

4. A device according to claim 3, wherein said first and said second members both are of cylindrical form.

5. A device according to claim 1, wherein said printed circuit board is formed to a stripe like shape extending to the direction of relative movement of said members.

6. A device for electrically connecting a first member of cylindrical inside shape and second member movably inserted into said first member, both member being relatively movable, comprising a flexible printed circuit board located between said first and second members, said printed circuit board being of band form extending in the direction of the relative movement of said first and second members and being bent about 180° to form a turned "U" shaped portion, lying in a space defined by said first and second members, said "U" shaped portion having an area wider in the direction of the circumferential direction of said cylindrical inner surface of said first member than other areas, along said wider area said "U" shaped portion displacing due to the relative movement of said first and second members.

7. A device according to claim 6, wherein said first and said second members are in such relation that one of them is fixed, and the other is movable.

8. A device according to claim 7, wherein said movable member fixedly carries an actuator connected to the free end portion of said printed circuit board.

9. A device according to claim 6, wherein said wider area of said printed circuit board has its wiring pattern formed only in the same lateral area as that of said other areas.

* * * * *